(12) United States Patent
Howard

(10) Patent No.: US 6,298,165 B1
(45) Date of Patent: *Oct. 2, 2001

(54) METHOD FOR IMPROVING DATA ENCODING AND DECODING EFFICIENCY

(75) Inventor: Paul Glor Howard, Morganville, NJ (US)

(73) Assignee: AT&T Corp., New York, NY (US)

(*) Notice: Subject to any disclaimer, the term of this patent is extended or adjusted under 35 U.S.C. 154(b) by 0 days.

This patent is subject to a terminal disclaimer.

(21) Appl. No.: 09/537,230

(22) Filed: Mar. 28, 2000

Related U.S. Application Data

(63) Continuation of application No. 08/871,485, filed on Jun. 9, 1997, now Pat. No. 6,101,281.

(51) Int. Cl.[7] .............................. G06K 9/36; H03M 7/34; H03M 7/00
(52) U.S. Cl. ....................... 382/245; 382/246; 382/239; 341/107; 341/51
(58) Field of Search .................................. 382/232, 244, 382/239, 245, 246, 247; 341/51, 107, 106, 65, 67

(56) References Cited

U.S. PATENT DOCUMENTS

| | | |
|---|---|---|
| 5,272,478 | 12/1993 | Allen .................................. 341/151 |
| 5,381,145 * | 1/1995 | Allen et al. ........................ 341/107 |
| 5,546,080 | 8/1996 | Langdon, Jr. et al. .............. 341/51 |
| 5,680,129 | 10/1997 | Weinberger et al. ................ 341/65 |
| 5,717,394 | 2/1998 | Schwartz et al. .................... 341/51 |
| 5,751,860 | 5/1998 | Su et al. ............................. 382/244 |
| 6,101,281 | 8/2000 | Howard .............................. 382/245 |

OTHER PUBLICATIONS

Ono, Fumitaka, et al., "Bi-Level Image Coding With Mel-code Comparison of Block Type Code and Arithmetic Type Code", IEEE, pp. 0255–0260 (1989).

* cited by examiner

Primary Examiner—Thomas D. Lee
Assistant Examiner—Wenpeng Chen
(74) Attorney, Agent, or Firm—Kenyon & Kenyon

(57) ABSTRACT

A method improves the efficiency of a compression technique by introducing a new parameter to be associated with a given probability range for events. When the new parameter is to be utilized, that parameter is associated with a table that matches codes to sequences of events. The coder receives the bit stream, detects a sequence of events and then reads the corresponding code from the table when the coder recognizes that the probability range with respect to the code corresponds to this new parameter. At the decoder the received bit stream is matched to table entries to determine the corresponding event sequence.

14 Claims, 4 Drawing Sheets

| PROBABILITY RANGE | PARAMETER | PATTERN | GENERATED CODE |
|---|---|---|---|
| 0.500 ≤ PROB (M) < 0.618 | R=1 | M<br>L | 1<br>0 |
| 0.618 ≤ PROB (M) < 0.755 | R=2 | MM<br>L<br>ML | 1<br>00<br>01 |
| 0.755 ≤ PROB (M) < 0.819 | R=3 | MMM<br>L<br>ML<br>MML | 1<br>00<br>010<br>011 |
| 0.819 ≤ PROB (M) < 0.869 | R=4 | MMMM<br>L<br>ML<br>MML<br>MMML | 1<br>000<br>001<br>010<br>011 |

| PROBABILITY RANGE | PARAMETER | PATTERN | GENERATED CODE |
|---|---|---|---|
| $0.500 \leq \text{PROB}(M) < 0.570$ | R=1 | M<br>L | 1<br>0 |
| $0.570 \leq \text{PROB}(M) < 0.682$ | R* | MMM<br>MML<br>ML<br>LM<br>LL | 11<br>101<br>01<br>00<br>100 |
| $0.682 \leq \text{PROB}(M) < 0.755$ | R=2 | MM<br>L<br>ML | 1<br>00<br>01 |
| $0.755 \leq \text{PROB}(M) < 0.819$ | R=3 | MMM<br>L<br>ML<br>MML | 1<br>00<br>010<br>011 |
| $0.819 \leq \text{PROB}(M) < 0.869$ | R=4 | MMMM<br>L<br>ML<br>MML<br>MMML | 1<br>000<br>001<br>010<br>011 |

METHOD FOR IMPROVING DATA ENCODING AND DECODING EFFICIENCY

This application os a continuation of U.S. application Ser. No. 08/871,485 file on Jun. 9, 1997, which issued as U.S. Pat. No. 6,101,281.

BACKGROUND OF THE INVENTION

The present invention is directed to a method for improving efficiency of data encoding and decoding. Specifically, the present invention is directed to a method for enhancing an entropy encoder to reduce the worst case inefficiency of such an encoder.

As people seek to communicate more and more frequently in the digital domain, that is transferring digital data between a source and a receiver, a limiting factor is the availability of channel resources. Channels typically are provided with a predetermined bandwidth based on the physical characteristics of the channel itself. To therefore increase the overall information throughput along the channel, it is beneficial to provide capabilities by which information can be transmitted through the channel utilizing the least amount of bandwidth possible.

FIG. 1 illustrates an example of a prior art configuration for transmitting data from a source to a receiver which keeps this goal in mind. In particular, source information, which ultimately could be in analog form and has been digitized by some analog to digital converter (not shown) is provided to a compression device 101. The compression device operates on the digital bit stream to reduce the number of bits needed to represent the information received from the source. Such information can take the form of a bit stream that is representative of some event, that is, for example, letters in text or pixels in an image. The compressed data is then provided to an encryption device 102 which can "scramble" the data to make it unusable by anyone who is not aware of both the encryption technique and the encryption key. This safeguards the data from being taken off of the channel by some third party and used without permission of the source. The encrypted data is provided to an error correction code (ECC) generator. This ECC generator provides additional information based on the encrypted data so as to permit the receiver to reconstruct data even where some limited number of errors occur in the course of the transmission of the data from the source to the receiver. The data is then provided to the channel 104. At a receiving end the data is then passed to a device referred to as "EEC-decoder" 105 which uses the transmitted error correction code information to present a corrected data bit stream to the decryption device 106. The decryption device then deciphers the received data based on some encryption key to essentially provide to the decompression device 107 the same data bit stream which was provided from the compression device 101 to the encryption device 102. The decompression device thus takes what amounts to be the compressed data bit stream and expands it for use by the receiver (not shown).

FIGS. 2A and 2B are block diagram representations of portions of the compression device and the decompression device of FIG. 1, respectively. In FIG. 2A the compression device may include an encoder modeler 201 and a coder 202. In this context the modeler and the coder will both receive the digital representation of events. The modeler will provide probabilities with respect to the events, for example, the probability that the letter "u" will follow the letter "q", to the coder. The coder takes this probability and based on the nature of the coder tries to produce a bit stream with the fewest bits possible.

FIG. 2B relates to what transpires at the receiver in the decompression module. In this instance, the coded bit stream is provided to the decoder 204. Again, the modeler provides probability information to the decoder so that the decoder can take the coded bit stream and provide a stream of decoded events to the receiver as well as feeding the events back to the modeler. Such modelers are well known in the art.

Sometimes it may be desirable to use different codes in the same application and to have the output from the different coders appear in the same coded bit stream. One way to insure decodability is to have the encoder arrange the bits and the coded bit stream so that the decoder, by reading bits sequentially, will automatically extract those bits it needs, exactly when it needs them. This mechanism is called decoder-synchronized encoding. This technique has been described in literature, for example, "Bi-Level Image Coding with Melcode-Comparison of Block-Type Code and Arithmetic-Type Code", Ono et al., proceedings IEEE Global Telecommunications Conference, November 1989.

The prior art specifically describes interleaving codes referred to as run-length codes. These codes are based on the notion of producing a bit stream that represents how many occurrences in a row there are of more probable events. One example of such a run length code is referred to as a Golomb code described in "Run-Length Encodings", Golomb, IEEE Trans. Inform Theory It—12, (July 1966), 399–401.

As an example, run-length codes can be based on a two-symbol alphabet (M,L) where M refers to a more probable event and L refers to a less probable event. The Golomb code is designed to send a bit stream that is representative of the length of a run of the more probable symbol, that is the number of consecutive times the more probable symbol has appeared. For purposes of this explanation, assume that the run corresponds to "n" consecutive occurrence of the more probable symbol, M. Then in accordance with the Golomb code, n=uR+b where $0 \leq b < R$ and R is considered to be the Golomb code parameter. R is typically expressed as $R=2^P+Q$. For ease of discussion it is assumed for the moment that Q=0. Also as an example, let's assume that R=8, that is the coder is looking for blocks of eight consecutive occurrences of the more probable event. Also assume for this example that the run length n=19. In that circumstance, solving the equation n=uR+b yields that 19=2X8+3, so u=2 and b=3. The coder then outputs u in unary form, that is "u" number of is followed by 0, for instance, here since u=2 then the output of u in unary is 110. To complete the code for n=19, b is output in P-bit binary. Here since the block size is $2^P=8$, P=3, so b is expressed in 3-bit binary form, or as 011. The code then for n=19 is 110011. This represents the following string of events MMMMMMMMMMMMMMMMMMML. Thus, 20 events (19M+1L) are represented in six bits.

It is known that if Q does not equal 0 then if $0 \leq b < 2^P$-q, b is then output is a P-bit binary number while if $2P-Q \leq b < 2^P$ then $b+2^P$-Q is output as a (P+1)-bit binary number. However, for ease of discussion, while the present invention may be applied to such circumstances, the embodiment described herein will presume that Q=0.

The Ono paper describes a method for interleaving Golomb codes that have different R parameters. Block Melcode uses decoder-synchronized encoding that is accomplished by encoder buffering. If a run of n occurrences of the more probable symbol (M) is being coded using Golomb parameter R, a block of R consecutive occurrences of M will add a one to the unary part of the expression for n. This "1" can be queued for output immediately. After some number of these blocks of M, a block will occur containing b Ms followed by a "less probable symbol" L and the run will end. To be properly decodable a block's encoding must appear in the output stream when the decoder is ready to decode the first symbol in the block. The output of blocks coded with other parameters will usually appear between blocks coded with any given parameter. Ordering and buffering the output blocks is the essence of the block Melcode. To decode a symbol that was coded using parameter R the decoder extracts either a 1 indicating the occurrence of R consecutive Ms, or a 0 followed by P or P+1 bits which indicate (after decoding the value of b from those bits) the occurrence of b consecutive Ms followed by an L. Until all the symbols from the block have been decoded, the decoder will not have to extract any more bits from the coded data stream for symbols coded with parameter R. At the end of encoding, unfinished blocks can be coded as though they were filled with Ms. This merely leaves the decoder with unneeded symbols. A similar mechanism can be used to flush the output queue of the encoder if too many blocks are queued for output. In this case, the decoder can recognize the situation by tracking the encoder's queue size and can discard the unneeded symbols.

To this point only the encoder operation has been described, however the decoder works in a similar fashion. First since this is a decoder-synchronized encoding technique the decoder knows which bits in the bit stream apply to a given block Melcode. Thus, the modeler and decoder combination, such as in FIG. 2 can take a block Melcode associated with a given R parameter and recreate the string of events. For example, if the decoder detects "11101" for a block Melcode with R parameter equal to 2 then this corresponds to MMMMMMML.

The block Melcode is known to be somewhat inefficient in its compression performance. Even where the parameter R is selected based on the probability of the more probable event, there are inefficiencies introduced by the block Melcode. FIG. 3 provides a graphical representation of the percentage of inefficiency versus the probability of the more probable symbol with Golomb codes with various R parameters. It can be seen that a spike of as high as 4.2% inefficiency occurs in the area where the probability of M is approximately 0.618 where probabilities are expressed in the range of from 0 to 1. It would be advantageous to provide a technique by which this inefficiency of the block Melcode could be improved thereby enhancing the compression performance of a coder employing such block Melcodes.

SUMMARY OF THE INVENTION

The present invention is directed to a method for improving compression performance. In particular, the present invention is directed to a method for improving the efficiency of an entropy encoder. In accordance with the present invention, rather than calculate a code for a run of events of a particular probability range, the coder accesses a table and outputs a predetermined code for the run where the table is constructed in advance to improve the compression performance of the coder.

In addition, the present invention improves the decoding efficiency as well by using a table look up to correlate a received code, associated with a particular probability range, with a pattern of most probable and less probable events.

In accordance with an embodiment of the present invention, the method is applied to block Melcodes in which a plurality of Golomb codes are interleaved. A unique parameter is assigned to those situations where the probability of the more probable event falls within a particular range, in a specific embodiment between 0.570 and 0.682. Where the probability of the more probable event falls within this range, then for coding rather than calculate or compute a code based on the R parameter, the coder reads out a code from a table where the code that is read out corresponds to a code associated with a pattern for most probable events which matches the detected occurrence. For decoding, rather than reconstruct the sequence based on some algorithm the decoder reads out the appropriate sequence from a table.

DETAILED DESCRIPTION

Figure 1:
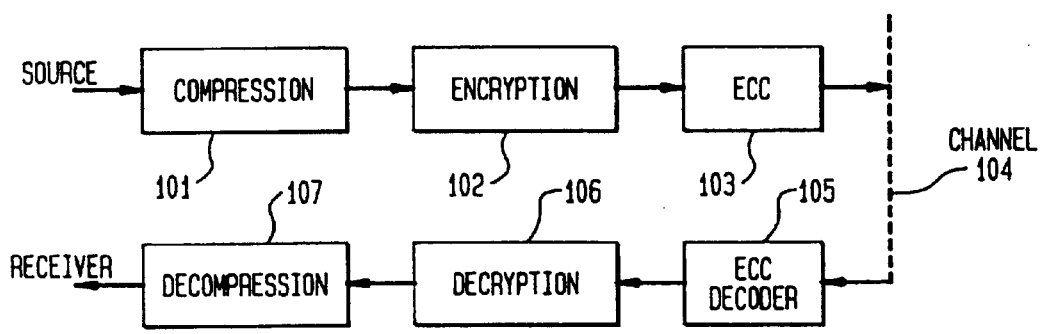
FIG. 1 illustrates a prior art configuration for transmission and reception of data in block diagram form.
Figure 2A:
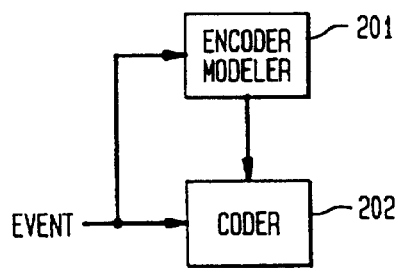
FIG. 2 illustrates in block diagram form examples of a compression element and an expansion element from FIG. 1.
Figure 2B:
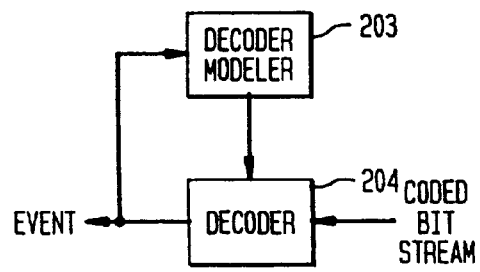
Figures 3, 4:
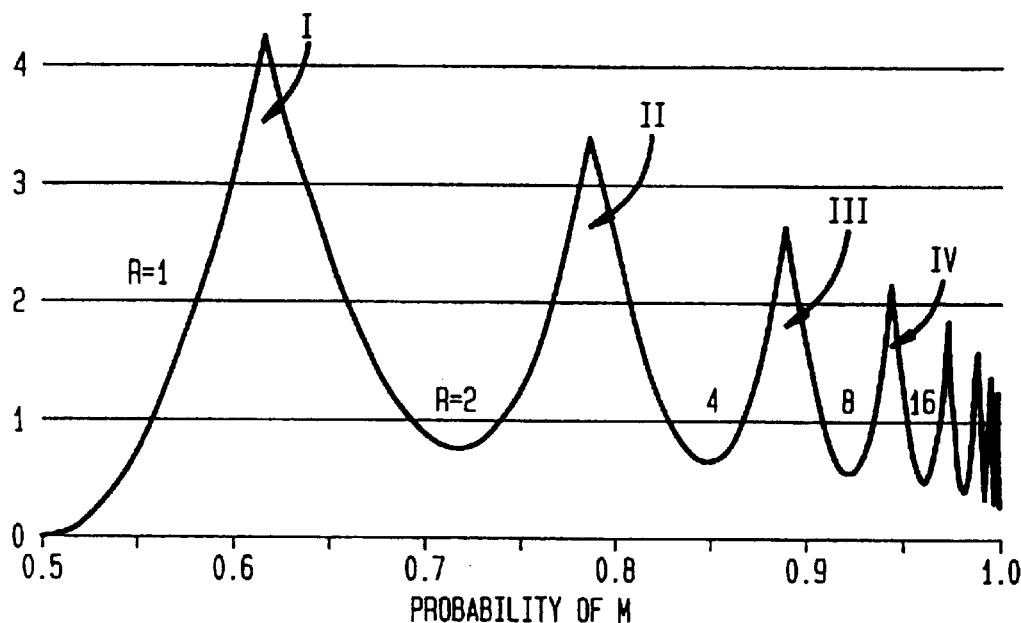
FIG. 3 provides a graphical representation of inefficiencies with respect to a known encoding technique.
FIG. 4 illustrates a table that represents how codes are computed using various parameters that are dependent upon event probabilities.
Figures 5, 6:
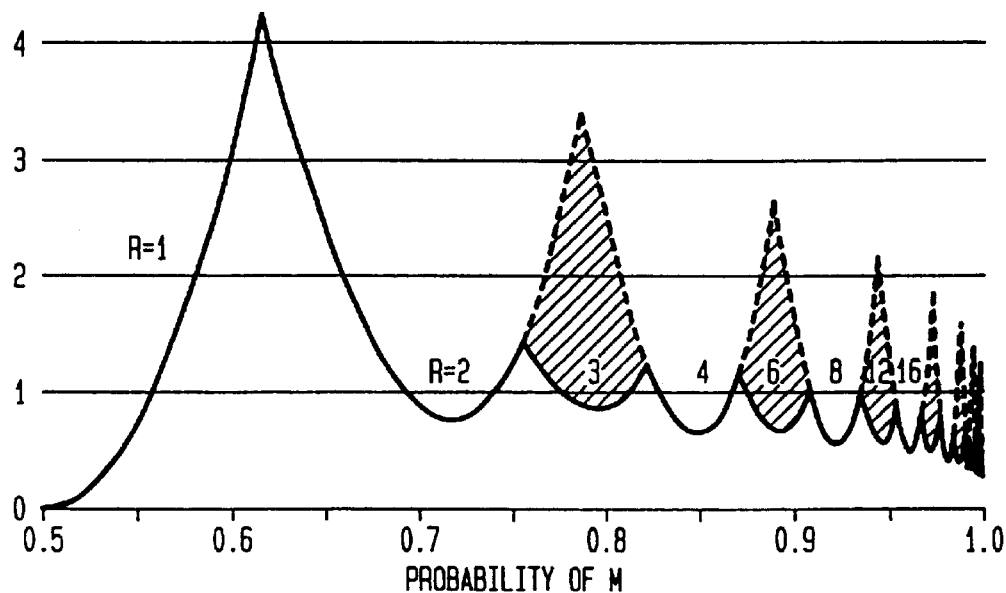
FIG. 5 provides another graphical representation of the percent inefficiencies of a known coding technique.
FIG. 6 illustrates an embodiment of a coding technique employing the present invention.

The present invention, which will be described in more detail below, improves the compression performance of a typical run length coder. Efficiencies are already enhanced in known interleaved block Melcodes by selecting an appropriate R parameter based on the probability of the most probable event. For example, as shown in FIGS. 3 and 5, the more finely defined the R parameter the more efficiencies are introduced. As shown in FIG. 5 with R parameters 3, 6, 12 added further efficiencies are provided in comparison to the Melcoding shown in FIG. 3 as indicated by the shaded regions. However, simply increasing the number of parameters does not reduce the worst case scenario shown in FIG. 3, namely the inefficiency of approximately 4.2% at the probability occurring between R=1 and R=2 where the probability of the more probable event M is approximately 0.618. The present invention reduces this inefficiency by almost a factor of 3 by adding a new parameter, referred to for reference sake as R*. The coder and decoder would use this parameter for any event where the probability of the more probable event falls within a range such as from 0.570 to 0.682. When this parameter is selected, the encoding and decoding are carried out by a different technique than is normally performed with the other R parameters. Specifically, whereas using any of the other R parameters, the code is calculated based on the number of occurrences and the formula uR+b, there is no calculation performed with respect to events associated with the parameter R*. Instead, when the coder detects an event having the parameter R*, it refers to a prestored table and matches the sequence of events to stored sequences in the table and then selects the code matching the detected sequences and supplies the code as an output code. Similarly, on the decoding side, rather than re-construct the sequence from the code using an algorithm associated with the parameter, the decoder matches the code to one of a series of codes stored in a table and reads out the corresponding sequence.

Figure 7:
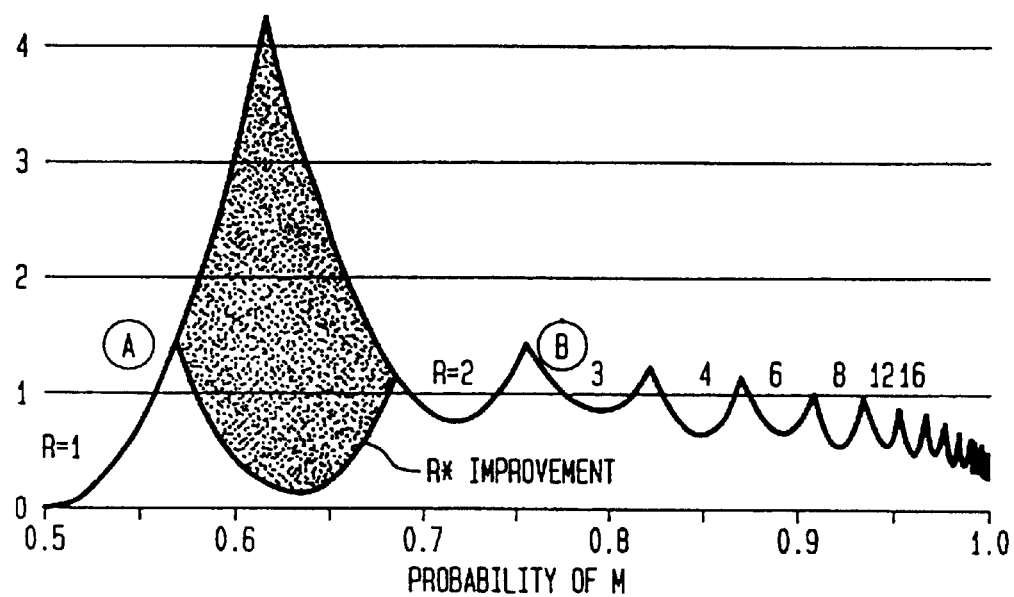
FIG. 7 illustrates a graphical representation of an improvement with respect to coding efficiency provided by the present invention.

FIG. 7 provides a graphical representation that illustrates the improvement to the block Melcode efficiency by employing a parameter such as R*. In this instance, the peak insufficiency can be reduced from 4.2 percent to 1.4 percent as shown at point A. The gained efficiency is shown in the shaded region of FIG. 7. The details of the compression performance analysis and the construction of the R* parameter will now be described.

If a Golomb coder with parameter $R=2^P+Q$ is used as a run length coder to encoder to encode independent events with probability of MPS=A≧½, the expected value of the code length per input event is $$L_R(a) = (1-a)\left(P + \frac{1 - a^R + a^{2^P - Q}}{1 - a^R}\right) \quad (1)$$

Equation 1

By setting $L_{R0}(a) = L_{R1}(a)$ for any two different values of R and solving the resulting polynomial equation, one can compute the cut-off probability $a_{R0,R1}$ for which parameters $R_0$ and $R_1$ work equally well. It is then possible to choose a subset of all Golomb codes to bound the compression inefficiency (either in percentage or in excess bits per event) at the cut-off probabilities and use that subset in a block Melcode. Typical choices are to use all Golomb codes whose parameter is less than a specified value, or to use only the power of 2 Golomb codes (also known as Rice codes), again with the maximum parameter value. An example of the percent inefficiency using Rice codes, that is Golomb codes having R values of a power of 2 (e.g., 1, 2, 4, 8, etc.) is shown in FIG. 3. Here the inefficiency exceeds 4.2 percent in a probability of approximately 0.618. It is determined that if all Golomb codes whose parameter is less than a specified value are used then too many parameter values to be practical are employed since they all must be buffered separately. It is also determined that if only power of 2 Golomb codes are used then there are too few codes since there are a number of regions of inefficient coding, see regions I., II., III., IV., etc. It is determined that an excellent choice is to use $S^* = \{R|R=2^P\} \cup \{R|R=3 \times 2^P\}$, that is, $S^* = \{1, 2, 3, 4, 6, 8, 12, 16, 24 \ldots\}$, with some maximum parameter value. The compression performance of this arrangement is illustrated in FIG. 5. It is seen here that the inefficiencies in regions II., III., IV., etc. have been reduced. However, the peak inefficiency of I. is not addressed in this arrangement.

Examples of the outputs provided by the Golomb codes depending on the parameter variation are shown in FIG. 4. For example, the parameter where R=1 is assigned to the probability range of 0.500 to 0.618. In this circumstance, if the more probable event M occurs then a unary code 1 is output since the block size 1 of more probable events has occurred. If the less probable event L occurs then the code 0 is generated. If the more probable event has a probability of from 0.618 to 0.755 and the R parameter is 2 as is known then the indicated patterns generate the shown codes using the formula n=uR+b. Similarly, an event having a probability of 0.755 to 0.819 is assigned an R parameter of 3 while an event having a probability of its more probable event in the range of 0.819 to 0.869 is assigned parameter 4.

Assume for purposes of an example that for an event whose more probable event occurs within the region 0.618 to 0.755, that is R=2 and the number of consecutive occurrences of the more probable event is 5 then the coder produces or generates a code indicating two consecutive blocks of the more probable event, that is four occurrences of the event, constituting the unary code 110, as well as one additional occurrence of the more probable event followed by a less probable event, thereby producing the code 01. The final code would thus be 11001 to indicate the occurrence of five consecutive appearances of the more probable event followed by the less probable event.

The worst case performance of a block Melcode that chooses among all Golomb codes occurs at $a_{1,2} = (\sqrt{5} - 1) \div 2$ approximately 0.618034. For this probability the expected code length is one bit per event, about 4.23% more than the entropy (0.959419 bit per event).

To remove this efficiency, the present invention relaxes the requirement that a block must correspond to events coded with a Golomb code that is, the present invention introduces a new parameter for which the coder accesses a table of codes rather than generates a code based on the number of occurrences. Specifically, FIG. 6 illustrates how the new parameter R* and its associated table of codes would fit into the coding scheme employing various Golomb codes. In this instance, for probabilities near $a_{1,2}$ where the R=1 and R=2 Golomb codes both do relatively poorly, the present invention groups events into a more complicated structure than simply runs of more probable events possibly followed by a less probable event. In this region, an input block consists of two or three events, three only if the first two are both more probable events. The output is also either two or three bits as shown. For instance, in FIG. 6 the R* parameter is applied in those circumstances where the probability of the most probable event falls in the range of 0.57 to 0.682. In those circumstances if there are three consecutive occurrences of the more probable event M then the decoder reads from the table the code 11. If the sequence detects is MML then the decoder reads the code 101 from the table. If the sequence is ML then the coder reads 01 from the table. If the sequence is MN then the coder reads 00 from the table. If the coder detects a sequence of LL then the coder outputs the code 100 from the table. It should be noted that other assignments of bits to the code words work equally well as long as the code word lengths remain the same.

Thus, in this embodiment of the invention, whenever the coder is coding with respect to a probability region of approximately 0.57 to 0.682 the coder is simply detecting a sequence of events and comparing the detected sequence to sequences stored in a table. Upon finding a matching sequence the coder reads out a code corresponding to that sequence from the table. This is distinctly different from what occurs with respect to any of the other parameter-based Golomb codes where the code is generated based on the detected sequences.

The expected value of the code length per input event for this new parameter value R* is $$L_{R*}(a) = \frac{3 - 2a + 2a^2 - a^3}{2 + a^2} \quad \text{Equation 2}$$

As described above, when the R* parameter is employed in connection with the block Melcoding thereby defining a new block of codes for a particular probability range, the worst case percentage inefficiency is reduced from 4.23 at the probability of 0.618 to approximately 1.43 (a reduction of over 66%), at a≈0.570. It also reduces the worst case number of excess bits per event by over 65% to 0.0141201 at a≈approximately 0.57.

The invention thus far has been described with reference to the coder. However, the decoder also employs the invention using a table to decode bit streams associated with events classified into a particular probability range. Thus, when the coded bit stream is received, since the system employs decoder-synchronized encoding, the decoder knows the R parameter associated with various bits in the stream. It can then take out the R* related bits and do a table translation reading out an event sequence that corresponds to the code that matches the received bit stream. Thus, for events with the prescribed probability, the decoder does not reconstruct the event sequence using any algorithm but instead uses a table look up specifically designed to better optimize efficiency in that probability range.

In effect, the present invention improves the efficiency of the coding technique dramatically by applying, to a limited probability region, a new parameter which requires table look ups for coding values rather than a computation of codes using a typical run length coding algorithm such as a Golomb code. One of ordinary skill in the art would recognize that the present invention could also be used to enhance coding systems that use decoder-synchronized coding to interleave other parameter-based run length codes other than Golomb codes. The main advantage is the large reduction in inefficiency for specific probability ranges.

The above invention has been described referring to specific probability ranges for ease of understanding. It should be understood that alternative ranges may be applicable where a code table can provide improved efficiency in that range.

It should be clear to one of ordinary skill in the art that the above described operations are implementable in software operating on a general purpose computer.

What is claimed is:

1. A method for enhancing block Melcodes, the method comprising the steps of:
    creating a table of codes corresponding to a finite number of possible sequences of data elements;
    associating said table with a group of events in which a more probable data element in said group has associated therewith a particular probability range;
    assigning a coding parameter to said table;
    identifying, in a data stream, data elements corresponding to said coding parameter; and
    coding the identified data elements in accordance with codes in said table,
    wherein said table includes at least one possible sequence of data elements that contains at least two of a less probable data element.

2. The method of claim 1 wherein said less probable data elements occur consecutively in said at least one possible sequence of data.

3. The method of claim 2 wherein said more probable data element has a probability greater that 0.55 and less than 0.69.

4. The method of claim 2 wherein said more probable data element has a probability greater than about 0.570 and less than about 0.682.

5. The method of claim 2 wherein said more probable data element has a probability greater than 0.570 and less than 0.682.

6. A method for encoding data in a data stream to provide data compression, the method comprising the steps of:
    identifying a particular sequence of more and less probable data elements in the data stream;
    locating said particular sequence of data elements in a coding table; and
    replacing said particular sequence of data elements with a corresponding code from said coding table,
    wherein said coding table contains codes corresponding to a finite number of possible sequences of data elements, and said table includes at least on possible sequence of data elements that contains at least two of a less probable data element;
    wherein the less probable data elements occur consecutively in the at least one possible sequence of data;
    and wherein said more probable data element has a probability greater than 0.55 and less than 0.69.

7. The method of claim 6 wherein said more probable data element has probability greater than 0.570 and less than 0.682.

8. A method for encoding data in a data stream to provide data compression, the method comprising the steps of:
    identifying a particular sequence of more and less probable data elements in the data stream;
    locating said particular sequence of data elements in a coding table; and
    replacing said particular sequence of data elements with a corresponding code from said coding table,
    wherein said coding table contains codes corresponding to a finite number of possible sequences of data elements, and said table includes at least one possible sequence of data elements that contains at least two of a less probable data element,
    wherein the less probable data elements occur consecutively in the at least one possible sequence of data;
    and wherein the more probable data element has a probability greater than about 0.570 and less than about 0.682.

9. A method for encoding data in a data stream to provide data compression, the method comprising the steps of:
    associating a coding parameter with a data element in the data stream;
    accessing a code stored in a table corresponding to said coding parameter, said table containing codes corresponding to a finite number of possible sequences of more and less probable data elements; and
    replacing a sequence of data elements having the same coding parameter with said code,
    wherein said more probable data element has a probability greater that 0.55 and less than 0.69.

10. The method of claim 9 wherein said more probable data element has a probability greater than about 0.570 and less than about 0.682.

11. The method of claim 9 wherein said more probable data element has a probability greater than 0.570 and less than 0.682.

12. A method for enhancing a run length encoding scheme, the method comprising:
    if the probability of an event in a data stream is within a first probability region;
        identifying a sequence of events in the data stream;
        calculating a code based on the run length encoding scheme corresponding to the sequence of events;
        coding the identified sequence in accordance with the calculated code;
    if the probability of the event in the data stream is within a second probability region;
        identifying the sequence of events in the data stream;

locating the sequence of events in an entry in a coding table, the entry associating the sequence of events with a predetermined code;

coding the identified sequence of events using the predetermined code.

13. The method of claim 12 wherein the run length encoding scheme is a Golomb encoding scheme.

14. The method of claim 13 wherein the Golomb encoding scheme employs a plurality of Golomb code parameters, each Golomb parameter being employed in a corresponding probability range for the event within the first probability region.

* * * * *